(12) United States Patent
Partridge

(10) Patent No.: US 10,732,105 B1
(45) Date of Patent: Aug. 4, 2020

(54) METHOD AND APPARATUS FOR CHARACTERIZING LASER GAIN CHIPS

(71) Applicant: Agilent Technologies, Inc., Santa Clara, CA (US)

(72) Inventor: Guthrie Partridge, Santa Clara, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 16/277,917

(22) Filed: Feb. 15, 2019

(51) Int. Cl.
| | |
|---|---|
| G01J 1/06 | (2006.01) |
| G01J 1/04 | (2006.01) |
| H01S 3/00 | (2006.01) |
| H01S 5/022 | (2006.01) |
| H01S 5/10 | (2006.01) |
| H01S 5/14 | (2006.01) |
| G01N 21/25 | (2006.01) |
| G01N 21/59 | (2006.01) |

(52) U.S. Cl.
CPC ..... *G01N 21/59* (2013.01); *G01N 2201/0612* (2013.01); *G01N 2201/0638* (2013.01)

(58) Field of Classification Search
CPC ........... G01N 21/59; G01N 2201/0612; G01N 2201/0638
USPC ....................................................... 250/341.2
See application file for complete search history.

(56) References Cited

U.S. PATENT DOCUMENTS

| | | | | |
|---|---|---|---|---|
| 6,665,321 | B1* | 12/2003 | Sochava | H01S 5/141 |
| | | | | 372/19 |
| 9,461,443 | B2* | 10/2016 | Beregovski | G01J 1/0411 |
| 9,876,330 | B1* | 1/2018 | Partridge | H01S 5/141 |
| 2002/0085609 | A1* | 7/2002 | Ksendzov | H01S 5/141 |
| | | | | 372/94 |
| 2003/0012239 | A1* | 1/2003 | Daiber | H01S 5/06808 |
| | | | | 372/38.01 |
| 2005/0088716 | A1* | 4/2005 | Kozlovsky | G02B 27/1073 |
| | | | | 359/237 |
| 2005/0128469 | A1* | 6/2005 | Hall | G01N 21/21 |
| | | | | 356/237.1 |

(Continued)

OTHER PUBLICATIONS

Hofstetter, et al., Loss Measurements on Semiconductor Lasers by Fourier Analysis of the Emission Spectra, Applied Physics Letters, 72, pp. 404-406, 1998.

(Continued)

*Primary Examiner* — Taeho Jo

(57) ABSTRACT

A system adapted for characterizing gain chips and a method for characterizing gain chips are disclosed. The system includes a probe light source that generates an output light signal characterized by a wavelength that can be varied in response to a wavelength control signal and a mounting stage adapted for receiving a gain chip characterized by a waveguide having a reflective face on a first surface of the gain chip and a transparent face on a second surface of the gain chip. The system also includes an optical system that focuses the output light signal into the waveguide through the transparent face; and a controller that causes the probe light source to generate the output light signal and measures an intensity of light both with and without the gain chip being powered for each of a plurality of different wavelengths to form a gain profile for the gain chip.

20 Claims, 3 Drawing Sheets

(56) References Cited

U.S. PATENT DOCUMENTS

| | | | | |
|---|---|---|---|---|
| 2005/0225823 A1* | 10/2005 | Ling | ................ | G02F 1/0147 359/237 |
| 2006/0082889 A1* | 4/2006 | Kozlovsky | ......... | G02B 27/1073 359/639 |
| 2007/0047599 A1* | 3/2007 | Wysocki | ................ | B82Y 20/00 372/20 |
| 2008/0159341 A1* | 7/2008 | Patel | ................ | B82Y 20/00 372/20 |
| 2010/0091804 A1* | 4/2010 | Musio | ................ | H01S 5/141 372/20 |
| 2011/0158270 A1* | 6/2011 | Patel | ................ | B82Y 20/00 372/29.021 |
| 2012/0099611 A1* | 4/2012 | Kim | ................ | H01S 5/141 372/20 |
| 2012/0268743 A1* | 10/2012 | Wang | ................ | H01S 5/0042 356/417 |
| 2014/0133509 A1* | 5/2014 | Rowlette | ............ | G02B 27/0911 372/50.1 |
| 2015/0244150 A1* | 8/2015 | Zhu | ................ | H01S 5/141 372/20 |
| 2015/0288141 A1* | 10/2015 | Fallahi | ................ | H01S 3/07 372/20 |
| 2015/0355482 A1* | 12/2015 | Akiyama | ................ | H01S 3/107 385/2 |
| 2016/0091704 A1* | 3/2016 | Hoke | ................ | G02B 21/08 348/79 |
| 2016/0268772 A1* | 9/2016 | Caneau | ................ | H01S 5/028 |
| 2017/0033532 A1* | 2/2017 | Partridge | ................ | H01S 5/141 |
| 2017/0082490 A1* | 3/2017 | Hoke | ................ | G01J 3/0224 |
| 2018/0109069 A1* | 4/2018 | Phillips | ................ | H01S 5/143 |
| 2018/0321144 A1* | 11/2018 | Kotidis | ................ | B82Y 20/00 |
| 2019/0341736 A1* | 11/2019 | Schultz | ................ | G01J 11/00 |

OTHER PUBLICATIONS

Revin, et al., Intersubband Spectroscopy of Quantum Cascade Lasers under Operating Conductions, Appl. Phys. Lett. 88, 131105, 2006.

* cited by examiner

METHOD AND APPARATUS FOR CHARACTERIZING LASER GAIN CHIPS

BACKGROUND

Many measurements of interest involve measuring the response of a sample to a light beam of a known wavelength as a function of the wavelength. The light source for many of these measurements is a tunable laser. Spectrographic systems in the mid-infrared range region (MIR) of the spectrum that utilize quantum cascade lasers are particularly useful in identifying the chemical composition of a specimen, since these lasers can be turned over a broad range of wavelengths in the region of the spectrum of interest. For the purposes of the present disclosure, MIR will be defined to be light between the wavelengths of 2.5 microns and 50 microns.

The tunable laser typically includes a gain chip, or other gain media, that amplifies light over a range of wavelengths and a cavity that includes a wavelength filter that determines the resonance wavelength of the filter. For example, in one type of external cavity laser, the cavity is formed by one facet of the gain chip and a diffraction grating that reflects light of the desired wavelength back to the gain chip. In this arrangement, the wavelength of the laser light can be varied by altering the angle at which the light leaving the gain chip strikes the grating.

The laser tuning range is determined by details of the external cavity and the gain as a function of wavelength of the gain chip. It would be advantageous to measure the gain profile as a function of wavelength for the gain chip without having to integrate the gain chip into an external cavity laser.

SUMMARY

The present invention includes a system adapted for characterizing gain chips and a method for characterizing gain chips. The system includes a probe light source that generates an output light signal characterized by a wavelength that can be varied in response to a wavelength control signal and a mounting stage adapted for receiving a gain chip characterized by a waveguide having a reflective face on a first surface of the gain chip and a transparent face on a second surface of the gain chip. The system also includes an optical system that focuses the output light signal into the waveguide through the transparent face; and a controller that causes the probe light source to generate the output light signal and measures an intensity of light both with and without the gain chip being powered for each of a plurality of different wavelengths to form a gain profile for the gain chip.

In one aspect, the probe light source includes a tunable quantum cascade laser (QCL). In another aspect, the probe light source includes a QCL that emits light in the MIR.

In another aspect, the optical system focuses the output light signal to a point on the transparent face, characterized by a location, the point being located at a point determined by the controller.

In another aspect, the controller causes the point to move over the transparent face while measuring an intensity of light leaving the gain chip while the gain chip is powered as a function of the location of the point on the transparent face.

In another aspect, the output light signal includes a collimated light beam and the optical system includes an optical element that focuses the collimated light beam to a point on the transparent face.

In another aspect, the optical element moves along a path that is parallel to the transparent face at a distance from the transparent face that remains constant while the optical element moves along the path.

In another aspect, the mounting stage moves the gain chip such that the gain chip is parallel to the transparent face.

In another aspect, the controller repeats the measurements for a plurality of different power levels in the gain chip.

In another aspect, the system includes a reflectivity standard having a known reflectivity as a function of wavelength of light in the output light signal, the reflectivity standard is positioned such that the controller can cause the optical system to focus the output light signal on the reflectivity standard and measure an intensity of light reflected from the reflectivity standard.

In another aspect, the controller is configured to measure an intensity of light reflected from the transparent face at locations that do not include the waveguide.

In another aspect, the gain chip includes a polarized medium characterized by a chip plane of polarization, and the output light signal is polarized with a plane of polarization that has a component that is aligned with the chip plane of polarization.

In another aspect, the probe light source includes a polarization assembly that adjusts the plane of polarization of the output light signal in response to signals from the controller.

In another aspect, the stage includes an actuator that rotates the gain chip about an axis perpendicular to the transparent face in response to signals from the controller.

The present invention also includes a method for characterizing a gain chip having a waveguide having a reflective face on a first surface of the gain chip and a transparent face on a second surface of the gain chip, the method includes generating a probe light signal characterized by a probe wavelength; focusing the light signal into the waveguide; and measuring an intensity of light leaving the transparent face both with and without the gain chip being powered for a plurality of different probe wavelengths.

In another aspect, the probe wavelengths are in the MIR.

In another aspect, the method includes focusing the probe light signal at a plurality of different points on the transparent face while the gain chip is powered and measuring an intensity of light leaving the transparent face at each of the plurality of different points to determine a location for the waveguide.

In another aspect, the gain chip is powered electrically by a gain chip power supply and the measured intensities are repeated for a plurality of different power levels from the gain chip power supply.

In another aspect, the method includes measuring an intensity of the probe light signal that is reflected from the transparent face at locations that do not include the waveguide.

In another aspect, the method includes measuring an intensity of the probe light that is reflected from a reflectivity standard to determine a reflectivity for the transparent face.

DETAILED DESCRIPTION

The manner in which the present invention provides its advantages can be more easily understood with reference to an apparatus and method for characterizing a QCL gain chip. However, it will be apparent that the method and apparatus of the present invention can be used to characterize other gain chips.

In general, the gain chip is characterized by a waveguide that includes an active layer that amplifies the light passing through the waveguide when the gain chip is powered. The waveguide connects two facets of the gain chip. Typically, the first facet is a reflecting surface, and the second facet is coated with an anti-reflecting coating. Light injected into the waveguide through the second facet is reflected from the first facet. Light passing through the waveguide is subjected to absorption. The magnitude of the absorption is a function of the wavelength of the light. When the gain chip is powered, light that is coupled into the waveguide is amplified by an amount that depends on the wavelength, and part of the light in the waveguide is lost to absorption.

Figure 1:
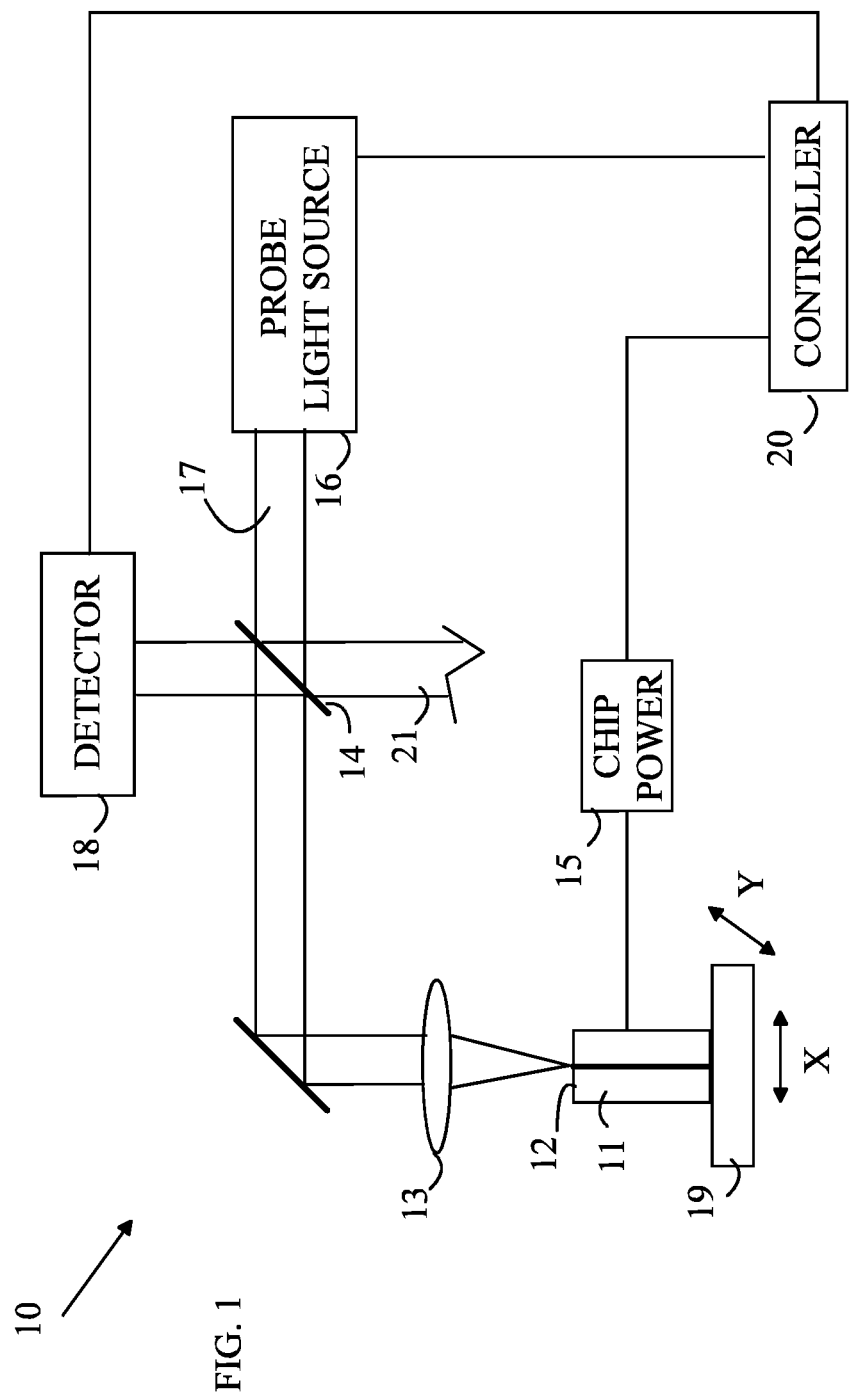
FIG. 1 illustrates one embodiment of a gain chip characterization system according to the present invention.

Refer now to FIG. 1, which illustrates one embodiment of a gain chip characterization system according to the present invention. System 10 injects a light signal from probe light source 16 into the waveguide of gain chip 11 through transparent face 12 of gain chip 11. Gain chip 11 has two opposing faces, which will be referred to as the reflecting face and the transparent face. Light enters gain chip 11 through the transparent face and is reflected from the reflecting face back toward the transparent face. When gain chip 11 is powered and the light intensity is amplified, the amount of amplification depends on the wavelength of the light. For the purposes of this application, the face through which the light enters the gain chip will be defined to be the transparent face. Transparent face 12 typically includes an anti-reflective coating. In general, the transparent face will not be perfectly transmitting, and there will be other losses within the gain chip. The less than perfect transmission can also be the result of absorption within the gain chip or partial reflection at the reflecting face.

System 10 uses detector 18 to measure the intensity of light leaving gain chip 11 when gain chip 11 is powered and when gain chip 11 is not powered. The ratio of these two power measurements can be used to measure the net gain provided by gain chip 11 at the wavelength of the light provided by probe light source 16.

Probe light source 16 preferably generates a monochromatic collimated light beam 17 characterized by a wavelength that is controlled by controller 20. Collimated light beam 17 passes through beam splitter 14 and is focused onto the transparent face of gain chip 11 at a location that ensures that the light is injected into the waveguide of gain chip 11. The portion of collimated light beam 17 that does not pass through beam splitter 14 forms a beam 21 that is directed to a beam dump in the present embodiment. In other embodiments, it may be useful to provide a detector that measures the beam intensity in beam 21 to monitor the output of probe light source 16. Light leaving gain chip 11 is collimated by lens 13 and a portion of that light is directed to a detector 18 by beam splitter 14.

The above-described measurements assume that gain chip 11 is positioned relative to lens 13 such that collimated light beam 17 is injected into the waveguide of gain chip 11. In system 10, this is accomplished by mounting gain chip 11 on an XY stage 19 that moves gain chip 11 relative to lens 13. The stage is operated to scan the beam over transparent face 12 while probe light source 16 is on and gain chip 11 is powered. The output of detector 18 as a function of X and Y is an image of transparent face 12 in which the location of the waveguide corresponds to a bright area in the image. Controller 20 then positions gain chip 11 such that the waveguide is centered on the incoming light.

Once controller 20 has correctly positioned gain chip 11 relative to lens 13, controller 20 computes the ratio of the output of detector 18 when gain chip 11 is powered off to the output of detector 18 when gain chip 11 is powered on. This ratio is recorded for a plurality of wavelengths of probe light source 16 to form a gain profile as a function of wavelength for gain chip 11. This profile may be used to simulate gain chip 11 when gain chip 11 is part of an external cavity laser, and hence, predict the behavior of the laser as a function of wavelength.

In general, the gain profile obtained by the above discussed procedure depends on the level of bias current provided to the gain chip by chip power supply 15, which is controlled by controller 20. Accordingly, in one aspect, controller 20 repeats the gain profile for a number of different chip power levels.

The range of wavelengths over which the gain profile of gain chip 11 can be measured depends on the range of wavelengths over which probe light source 16 can be tuned. Hence, it is advantageous to use a probe light source that can be tuned over a broader range of wavelengths than the range of wavelengths required for characterizing gain chip 11. In one aspect, probe light source 16 is constructed from an external cavity QCL. In another exemplary embodiment, probe light source 16 is constructed from a QCL in which the gain section includes multiple gain chips and/or a single gain chip with multiple active layers. In a still further embodiment, probe light source 16 is constructed from multiple lasers having different tuning ranges chosen such that the combined tuning range is sufficient to provide the bandwidth required to construct the gain profile for gain chip 11.

In the above-described embodiments, the gain chip is positioned relative to lens 13 by transparent face 12 using xy stage 19 to move gain chip 11 in two dimensions to form an image of transparent face 12. The time required to form such an image can be significant, hence the rate at which xy stage 19 can be moved is limited by the mass of the stage which can be quite significant. In applications in which this scanning time is limiting, a scanning assembly that can provide faster motion along one axis is preferred.

Figure 2:
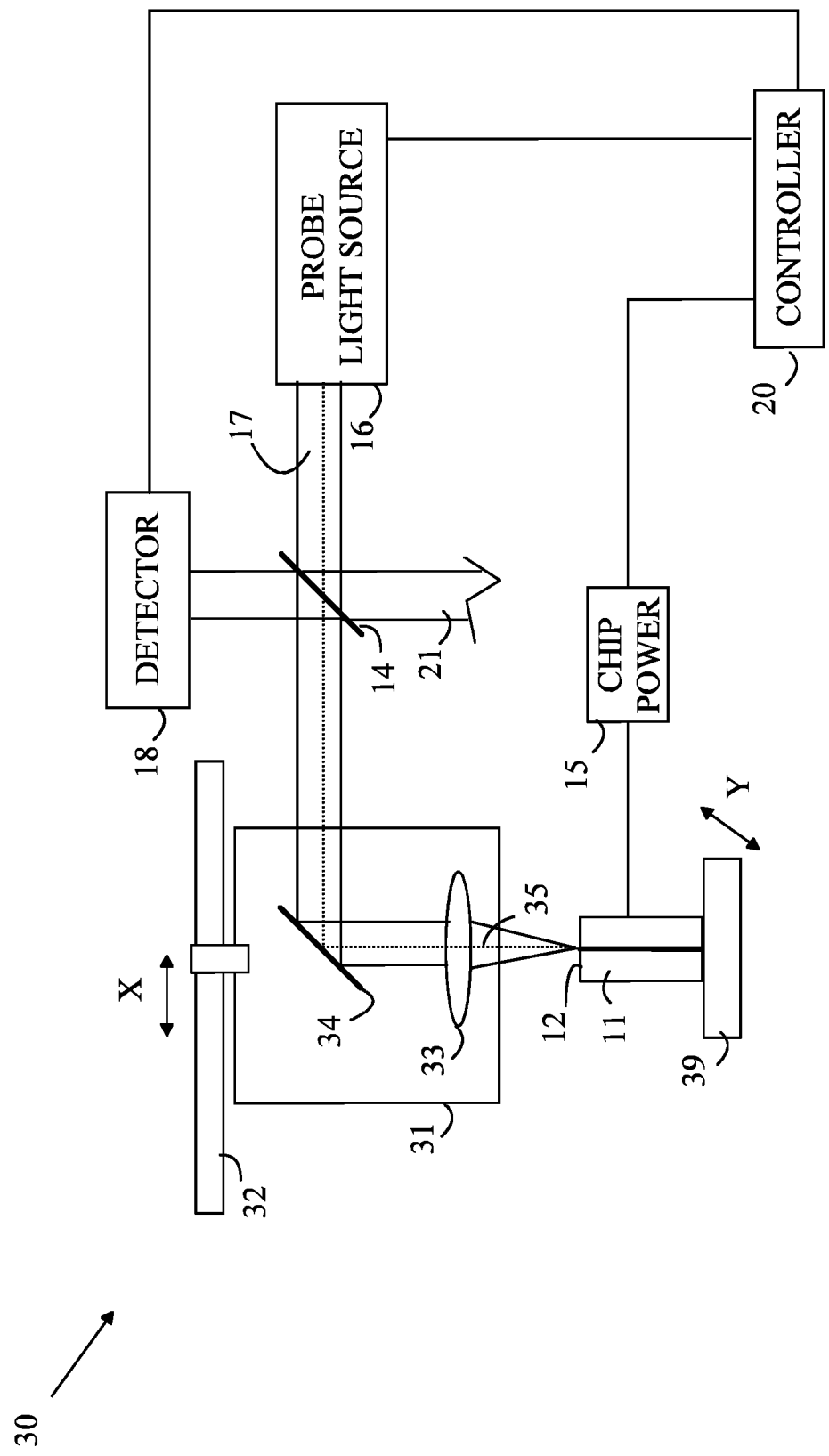
FIG. 2 illustrates another exemplary embodiment of a chip characterization system according to the present invention.

Refer now to FIG. 2, which illustrates another exemplary embodiment of a chip characterization system according to the present invention. System 30 utilizes a scanning assembly 31 comprising mirror 34 and lens 33 to focus collimated light beam 17 onto transparent face 12 at a location determined by the position of scanning assembly 31 along beam 32 on which scanning assembly 31 moves under the control of controller 20. Since the mass of scanning assembly 31 is substantially less than that of an XY stage such as xy stage 19, the position of the focal point on transparent face 12 can be moved with much greater speed than in the embodiment shown in FIG. 1. Scanning assembly 31 moves in a direction that is parallel to transparent face 12 as scanning assembly moves along beam 32. In addition, stage 39 also moves such that the focal point remains in the plane of transparent face 12, but in a direction orthogonal to X. Hence, the orientation of the optical axis 35 of the cone of light that is focused onto transparent face 12 remains constant as the focal point is scanned across transparent face 12. Accordingly, the efficiency with which light is coupled into and out of the waveguide of gain chip 11 does not change as the focal point moves across transparent face 12 in the waveguide.

If the gain chip is designed to be powered in a pulse mode, it is advantageous to provide a pulsed probe light source and to operate the gain chip in a pulsed mode.

Figure 3:
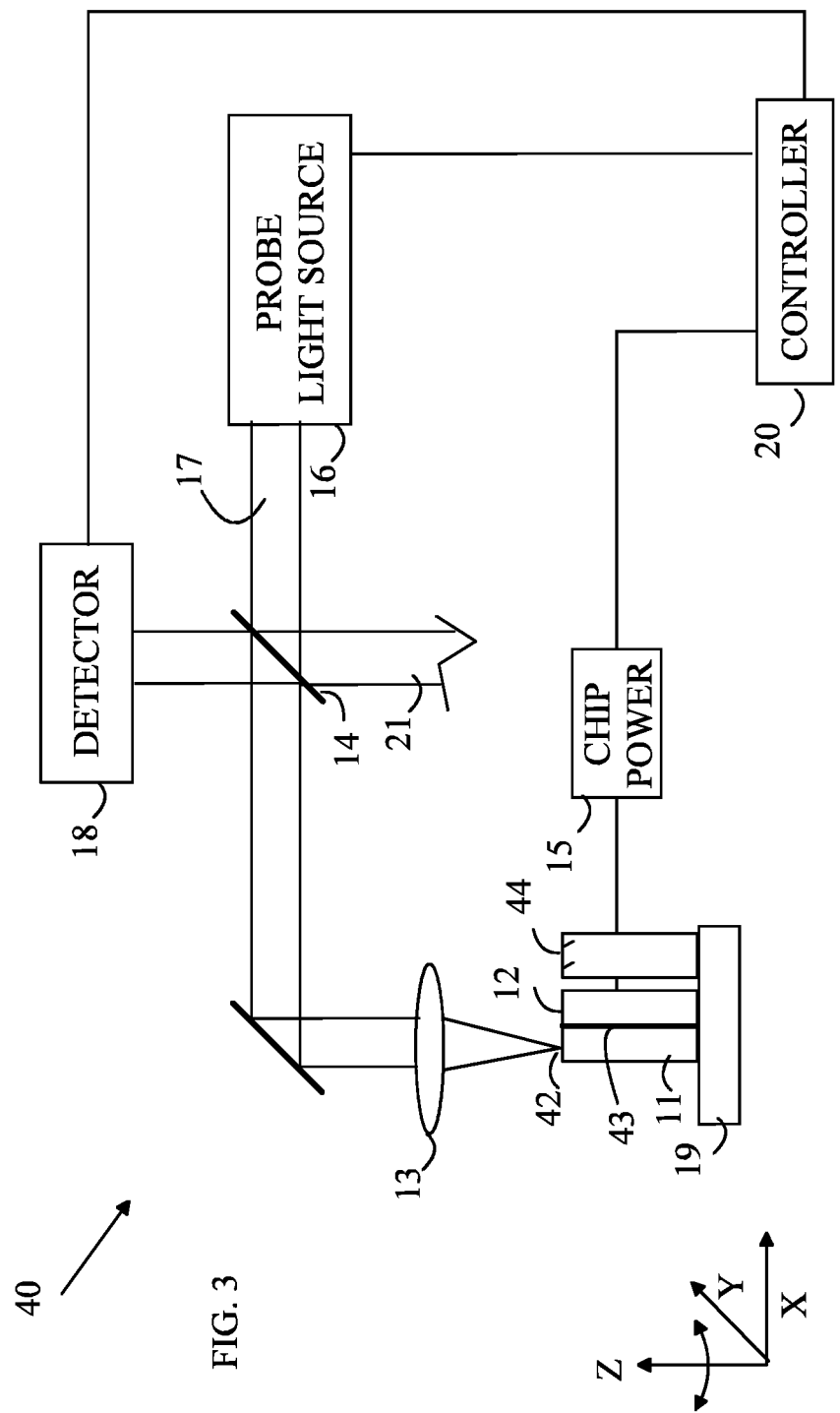
FIG. 3 illustrates an embodiment of a scanning assembly that can measure both the absolute and relative reflectivity of the front face of the gain chip.

The apparatus discussed above can also be used to measure the reflectivity of the transparent face of the gain chip. While in the ideal case, transparent face 12 of gain chip 11 is coated with an anti-reflective coating, the face may still have a finite reflectivity. In one aspect of the apparatus and method of the present disclosure, the apparatus is used to measure this reflectivity. Refer now to FIG. 3, which illustrates an embodiment of a scanning assembly that can measure both the absolute and relative reflectivity of the front face of the gain chip. To simplify the following discussion, those elements of scanning assembly 40 that serve functions analogous to elements shown in FIG. 1 have been given the same numeric designations and will not be discussed in further detail here unless the context requires otherwise.

To measure the reflectivity of transparent face 12, the gain chip 11 is positioned such that the light from probe light source 16 is focused to a point 42 on or near the surface of transparent face 12 at a location that is distant from waveguide 43. The scanning procedure discussed above can be used to map the transparent face 12 as a function of X and Y. A point that is distant from the bright area that corresponds to waveguide 43 is chosen for the reflectivity measurements. The light that is returned to detector 18 from point 42 when the probe light is focused at point 42 depends on the reflectivity of face 42. The absolute value of the reflectivity of transparent face 12 at point 42 can be determined by measuring the light returned from a calibration standard 44 having a known reflectivity.

For many gain chips, the light that is generated by the gain chip is polarized. When characterizing such gain chips, the probe light must have a significant complement that is polarized in the same direction. QCLs that generate a polarized output beam may be used for the probe source. Since the direction of polarization of the output light beam is known, the gain chip is preferably mounted on the stage such that the polarizations of the gain chip in the probe light beam are properly aligned. Alternatively, embodiments in which the probe light source includes a polarization rotation assembly can be utilized. In such embodiments, the angle of rotation of the probe light source is varied to maximize the light output from the gain chip when the gain chip is positioned such that the probe light beam enters the waveguide. In other embodiments, the stage on which the gain chip is mounted includes an actuator for rotating the gain chip about the z-axis shown in FIG. 3, in addition to moving the chip in the X and Y directions. The angle of rotation is varied until the output from the gain chip is maximized when the gain chip is positioned such that the probe light beam enters the waveguide. Here, the z-axis is perpendicular to the transparent face of the gain chip.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings.

Accordingly, the present invention is to be limited solely by the scope of the following claims.

What is claimed is:

1. A system comprising:
a probe light source that generates an output light signal characterized by a wavelength that can be varied in response to a wavelength control signal;
a mounting stage adapted for receiving a gain chip characterized by a waveguide having a reflective face on a first surface of said gain chip and a transparent face on a second surface of said gain chip;
an optical system that focuses said output light signal into said waveguide through said transparent face; and
a controller that causes said probe light source to generate said output light signal and measures an intensity of light both with and without said gain chip being powered for each of a plurality of different wavelengths to form a gain profile for said gain chip.

2. The system of claim 1 wherein said probe light source comprises a tunable QCL.

3. The system of claim 2 wherein said QCL that emits MIR light.

4. The system of claim 1 wherein said optical system focuses said output light signal to a point on said transparent face, characterized by a location, said point being located at a point determined by said controller.

5. The system of claim 4 wherein said controller causes said point to move over said transparent face while measuring an intensity of light leaving said gain chip while said gain chip is powered as a function of said location of said point on said transparent face.

6. The system of claim 4 further comprising a reflectivity standard having a known reflectivity as a function of wavelength of light in said output light signal, said reflectivity standard being positioned such that said controller can cause said optical system to focus said output light signal on said reflectivity standard and measure an intensity of light reflected from said reflectivity standard.

7. The system of claim 1 wherein said output light signal comprises a collimated light beam and said optical system comprises an optical element that focuses said collimated light beam to a point on said transparent face.

8. The system of claim 1 wherein said optical element moves along a path that is parallel to said transparent face at a distance from said transparent face that remains constant while said optical element moves along said path.

9. The system of claim 1 wherein said mounting stage moves said gain chip such that said gain chip is parallel to said transparent face.

10. The system of claim 1 wherein said controller repeats said measurements for a plurality of different power levels in said gain chip.

11. The system of claim 1 wherein said controller is configured to measure an intensity of light reflected from said transparent face at locations that do not include said waveguide.

12. The system of claim 1 wherein said gain chip comprises a polarized medium characterized by a chip plane of polarization and wherein said output light signal is polarized with a plane of polarization that has a component that is aligned with said chip plane of polarization.

13. The system of claim 12 wherein said probe light source comprises a polarization assembly that adjusts said plane of polarization of said output light signal in response to signals from said controller.

14. The system of claim 12 wherein said mounting stage comprises an actuator that rotates said gain chip about an axis perpendicular to said transparent face in response to signals from said controller.

15. A method for measuring characteristics of a gain chip having a waveguide having a reflective face on a first surface of said gain chip and a transparent face on a second surface of said gain chip, said method comprising:
- generating a probe light signal characterized by a probe wavelength;
- focusing said probe light signal into said waveguide; and
- measuring an intensity of light leaving said transparent face both with and without said gain chip being powered for a plurality of different probe wavelengths.

16. The method of claim 15 wherein said probe wavelength is a MIR wavelength.

17. The method of claim 15 further comprising focusing said probe light signal at a plurality of different points on said transparent face while said gain chip is powered and measuring an intensity of light leaving said transparent face at each of said plurality of different points to determine a location for said waveguide.

18. The method of claim 15 wherein said gain chip is powered electrically by a gain chip power supply and wherein said measured intensities are repeated for a plurality of different power levels from said gain chip power supply.

19. The method of claim 15 further comprising measuring an intensity of said probe light signal that is reflected from said transparent face at locations that do not include said waveguide.

20. The method of claim 19 further comprising measuring an intensity of said probe light signal that is reflected from a reflectivity standard to determine a reflectivity for said transparent face.

\* \* \* \* \*